United States Patent [19]

Okumura et al.

[11] Patent Number: 4,680,488
[45] Date of Patent: Jul. 14, 1987

[54] MOSFET-TYPE DRIVING CIRCUIT WITH CAPACITIVE BOOTSTRAPPING FOR DRIVING A LARGE CAPACITIVE LOAD AT HIGH SPEED

[75] Inventors: Koichiro Okumura; Masayoshi Ohkawa, both of Tokyo, Japan

[73] Assignee: NEC Corporation, Tokyo, Japan

[21] Appl. No.: 621,313

[22] Filed: Jun. 15, 1984

[30] Foreign Application Priority Data

Jun. 15, 1983 [JP] Japan .................. 58-106990
Jul. 18, 1983 [JP] Japan .................. 58-130657

[51] Int. Cl.⁴ .................................... H03K 17/10
[52] U.S. Cl. .................... 307/482; 307/264; 307/448; 307/578
[58] Field of Search ............ 307/482, 578, 450, 448, 307/270, 200 B, 264

[56] References Cited

U.S. PATENT DOCUMENTS

| | | | |
|---|---|---|---|
| 3,710,271 | 1/1973 | Putman | 307/482 |
| 3,775,693 | 11/1973 | Proebsting | 307/450 |
| 4,176,289 | 11/1979 | Leach et al. | 307/578 X |
| 4,317,051 | 2/1982 | Young, Jr. | 307/578 X |
| 4,431,927 | 2/1984 | Eaton, Jr. et al. | 307/578 X |
| 4,500,799 | 2/1985 | Sud et al. | 307/450 X |
| 4,542,310 | 9/1985 | Ellis et al. | 307/482 X |

FOREIGN PATENT DOCUMENTS 156427 12/1980 Japan .................. 307/482

OTHER PUBLICATIONS

Knepper, "Dynamic Depletion Mode: An E/D MOSFET Circuit Method for Improved Performance"; *IEEE-JSSC*, pp. 542-548, 10/1978; vol. SC-13, No. 5.
Gabric et al., "MOSFET Self-Bootstrapping Inverter Driver Circuit"; *IBM-TDB;* vol. 24, No. 10, pp. 5055-5056, 3/1982.
Harroun, "Bootstrap Inverter Driver"; *IBM-TDB;* vol. 19, No. 3, pp. 827-828; 8/1976.

*Primary Examiner*—Stanley D. Miller
*Assistant Examiner*—D. R. Hudspeth
*Attorney, Agent, or Firm*—Sughrue, Mion, Zinn, Macpeak and Seas

[57] ABSTRACT

An improved driving circuit which can drive a large load at a high speed. The circuit comprises an input inverter receiving an input signal, a first buffer circuit, a capacitive feedback element coupled between an output of the first buffer circuit and the input inverter, and a second buffer circuit having an input terminal coupled to the output of the input buffer and an output terminal coupled to an input of the first buffer circuit.

10 Claims, 4 Drawing Figures

MOSFET-TYPE DRIVING CIRCUIT WITH CAPACITIVE BOOTSTRAPPING FOR DRIVING A LARGE CAPACITIVE LOAD AT HIGH SPEED

FIELD OF THE INVENTION

The present invention relates to a driving circuit formed of insulated gate field effect transistors.

BACKGROUND OF THE INVENTION

Boot-strap type driving circuits have been widely used to drive large capacitive loads such as decoders and data input/output circuits in memories. In such boot-strap type driving circuits, a potential at the gate of an output field effect transistor is raised above the power voltage through a boot-strap capacitor by a known boot-strap effect so that the output transistor is allowed to operate in the unsaturated region. That is, the output transistor can provide an output signal of the same value as the power voltage without any level reduction. Therefore, the boot-strap type driving circuit is suitable to drive large capacitive loads at a large amplitude and has been advantageously used in a variety of electronic systems.

However, in such boot-strap type driving circuits, it has been difficult to charge the output capacitor at a high speed, and hence the operational speed of boot-strap type driving circuits is low. The demand for high speed driving circuits is great, and thus, many attempts have been proposed in order to develop such high speed driving circuits. However, these attempts have been unsatisfactory.

SUMMARY OF THE INVENTION

It is an object of the present invention to provide a driving circuit which can drive a large load at a high speed.

A drive circuit according to the present invention is of the type having an input inverter receiving an input signal, an impedance element through which a power supply is applied to the input inverter, a first buffer adapted to operate in response to an output signal of the input inverter, and a capacitive element coupled between an output of the first buffer and the input inverter, and features a second buffer having an input terminal receiving the output signal of the input inverter, and wherein the output signal of the second buffer circuit is applied to the first buffer circuit for driving it.

According to the present invention, the output signal of the input inverter is amplified by the second buffer circuit, and then the amplified output signal is applied to the first buffer circuit. Therefore, a large load is not imposed on the output of the input inverter and the first buffer circuit can be driven by the amplified signal. As a result, the driving circuit according to the present invention can drive a large load at a high speed.

DETAILED DESCRIPTION OF THE INVENTION

In the following, by way of example, an explanation will be given for the case where N-channel MOS transistors are employed as insulated gate field effect transistors and a positive power voltage is used as a power supply $V_{cc}$.

First, with reference to FIG. 1, a prior art driving circuit will be explained.

Figure 1:
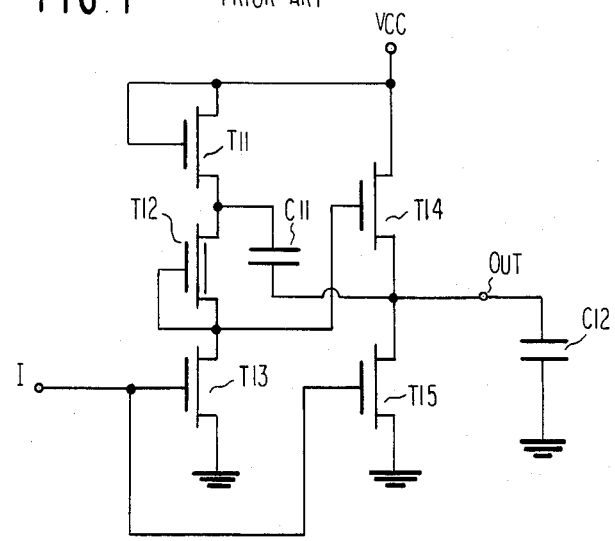
FIG. 1 is a circuit diagram showing a prior art driving circuit.

As shown in FIG. 1, the drain and gate of an enhancement MOS transistor $T_{11}$ serving as a load, or impedance element are connected to a power voltage terminal $V_{cc}$ and the source thereof is connected to one end of a coupling capacitor $C_{11}$ and also to the drain of a depletion MOS transistor $T_{12}$. The gate and source of transistor $T_{12}$ are commonly connected to the gate of an enhancement MOS transistor $T_{14}$ and the drain of an enhancement MOS transistor $T_{13}$. The gate of transistor $T_{13}$ is connected to a signal input terminal I and the source thereof is grounded. The drain of transistor $T_{14}$ is connected to the terminal $V_{cc}$ and the source thereof is connected to the other end of capacitor $C_{11}$ and also to the drain of an enhancement MOS transistor $T_{15}$ from which an output terminal OUT is drawn out. The gate of transistor $T_{15}$ is connected to the input terminal I and the source thereof is grounded. A load capacitor $C_{12}$ is connected to the output terminal OUT. The transistors $T_{12}$ and $T_{13}$ constitute an inverter circuit, and the transistors $T_{14}$ and $T_{15}$ constitute a buffer circuit.

When a signal input at the terminal I is at a high level, transistors $T_{13}$ and $T_{15}$ are turned on and transistor $T_{14}$ is turned off since a low level signal is applied to the gate of transistor $T_{14}$. Accordingly, the potential of the output terminal OUT is at a low level. Under this condition, the current flowing through the transistors $T_{11}$, $T_{12}$ and $T_{13}$ causes power consumption.

The conductance of the transistor $T_{11}$ is made far larger than that of the transistor $T_{12}$ and hence the potential at the source of the transistor $T_{11}$ is at the level of $(V_{cc}-V_{th})$, wherein Vth is the threshold voltage of the transistor $T_{11}$. In this state, the capacitor $C_{11}$ is charged to the potential $V_{cc}-V_{th}$.

When the input signal at terminal I drops to a low level, transistor $T_{13}$ is rapidly turned off and the gate of transistor $T_{14}$ is charged to a high level. Similarly, transistor $T_{15}$ is also turned off. Consequently, the potential at the output terminal OUT rises according to the charging current flowing through transistor $T_{14}$. The rise of the potential at the output terminal OUT is superposed through the capacitor $C_{11}$ on the drain of transistor $T_{12}$, which transmits this potential rise to the gate of transistor $T_{14}$. Thus, transistor $T_{14}$ is driven further into conduction. By repeating this loop, the potential at the gate of transistor $T_{14}$ eventually rises to a potential close to the value $(2V_{cc}-V_{th})$, and the potential at the output terminal OUT can be set at the power potential $V_{cc}$.

As explained above, the circuit shown in FIG. 1 can output the potential of $V_{cc}$ at its output terminal OUT without level reduction. However, when the load capacitor $C_{12}$ has an extremely large value such as several pF, transistor $T_{14}$ must have a large conductance in order to charge the capacitor $C_{12}$ at high speed.

In order to drive an output having a large capacitive load and to provide high speed switching, the on conductance of $T_{14}$ must be large, thereby keeping the time constant, RC, of the driving circuit low. However this necessitates a large transistor $T_{14}$. The large gate of $T_{14}$ will have a large stray capacitance which presents a large capacitive load to the inverter $T_{12}$, $T_{13}$. As a result, the charging time of this stray capacitance is relatively large and constitutes a large portion of the overall switching time of the driver circuit.

Figure 2:
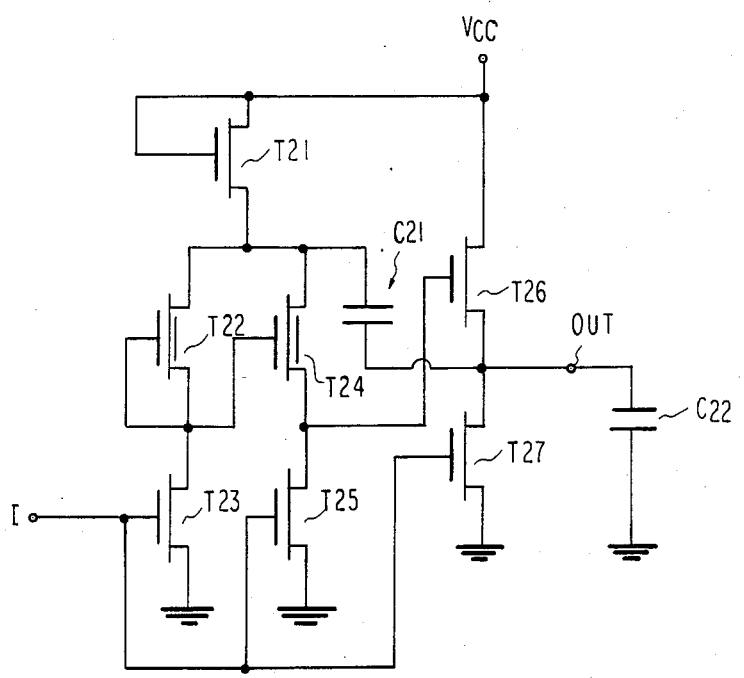
FIG. 2 is a circuit diagram showing a driving circuit according to a first embodiment of the present invention.

With reference to FIG. 2, a driving circuit according to one embodiment of the present invention will be described.

The basic difference between the prior art in FIG. 1 and the embodiment of FIG. 2, is that in FIG. 2, the feedback voltage from the output terminal OUT to the gate of output transistor $T_{26}$ goes through a second buffer circuit, $T_{24}$, $T_{25}$ having an additional stage of amplification. Thus, the current flow through $T_{24}$ for charging the gate of the output transistor is larger than that through $T_{12}$ of FIG. 1 and consequently the large capacitance of the gate of $T_{26}$ is charged faster than in FIG. 1.

The drain and gate of an enhancement MOS transistor $T_{21}$ are connected to a power voltage terminal $V_{cc}$, and the source of transistor $T_{21}$ is connected to the drains of both depletion MOS transistor $T_{22}$ and depletion MOS transistor $T_{24}$, and also to one end of a capacitor $C_{21}$. The source and gate of transistor $T_{22}$ are connected in common to the gate of transistor $T_{24}$ and the drain of an enhancement MOS transistor $T_{23}$. The gate of transistor $T_{23}$ is connected to an input signal terminal I, and the source thereof is grounded. The drain of an enhancement MOS transistor $T_{25}$ is connected to the source of transistor $T_{24}$ and also to the gate of an enhancement MOS transistor $T_{26}$. The gate of transistor $T_{25}$ is connected to input terminal I, and the source thereof is grounded. The drain of transistor $T_{26}$ is connected to power voltage $V_{cc}$, and the source thereof is connected to the drain of an enhancement MOS transistor $T_{27}$, the other end of capacitor $C_{21}$, and also to the output terminal OUT. The gate of transistor $T_{27}$ is connected to input terminal I, and the source thereof is grounded. A capacitor $C_{22}$ is a load capacitor.

The conductance of transistor $T_{26}$ is far larger than those of transistors $T_{22}$ and $T_{24}$, and hence the capacitance associated to the gate of the transistor $T_{26}$ is larger than that associated to the gate of the transistor $T_{24}$. Similarly, the conductance of the transistor $T_{27}$ is far larger than those of transistors $T_{23}$ and $T_{25}$.

A feature of this circuit is achieved by the substitution of an E/D (enhancement-depletion) push-pull buffer circuit composed of transistors $T_{24}$ and $T_{25}$ and an E/D inverter circuit composed of transistors $T_{22}$ and $T_{23}$ for the E/D inverter circuit composed of transistors $T_{12}$ and $T_{13}$ of FIG. 1.

When a signal at input terminal I is at a high level, transistors $T_{23}$, $T_{25}$ and $T_{27}$ are turned on and, since ground potential is applied to the gates of transistors $T_{24}$ and $T_{26}$, transistor $T_{26}$ is turned off and the output terminal OUT becomes grounded. Under this condition, the current flowing from the power voltage $V_{cc}$ to ground flows through a path of transistors $T_{21}$ to $T_{22}$ and $T_{23}$, and a path of $T_{21}$ to $T_{24}$ and $T_{25}$, and the sum of these two flows is the power consumption. The potential at the source of $T_{21}$ is equal to $V_{cc} - V_{th}$ as is the case with the prior art circuit of FIG. 1.

When the input signal changes from a high level to a low level, transistors $T_{23}$, $T_{25}$ and $T_{27}$ are turned off and the potential at the gate of transistor $T_{24}$ is at a high level. As a result, the potential at the gate of transistor $T_{26}$ rises to a high level. Transistor $T_{26}$ is turned on and the potential at the output terminal OUT rises. This change in potential is transmitted through capacitor $C_{21}$ to the connecting points between the source of transistor $T_{21}$ and the drains of transistors $T_{22}$ and $T_{24}$. The potential at the gate of transistor $T_{24}$ rises via $T_{22}$. As a result, the potential at the source of transistor $T_{24}$ rises thereby driving up the potential at the gate of $T_{26}$. Accordingly, since the driving capability of the transistor $T_{26}$ is increased and the rise in the potential at the output terminal OUT is accelerated, the load capacitor $C_{22}$ can be charged rapidly while maintaining the potential at the gate of the transistor $T_{26}$ above the power voltage $V_{cc}$. During this operation, the significant feature of the circuit of FIG. 2 resides in that the potential at the gate of transistor $T_{24}$ for driving transistor $T_{26}$ is always higher than that at the source of the transistor $T_{24}$ throughout the whole operation and thus, the charging speed required to charge the gate of the transistor $T_{26}$ can be 1.5 to 2 times faster as compared to the circuit of FIG. 1. For example, in the prior art circuit of FIG. 1, wherein the power voltage $V_{cc}$ is 5 V, the load capacitor $C_{12}$ 10 pF, the power current flowing through $T_{12}$ and $T_{13}$ 100 μA, and the circuit composed of N-channel silicon gate field-effect transistors, each of which has a channel length of 3μ and a 500 Å-thick gate oxide film, 20 ns is required from the change in the input signal from a high level to a low level to when the potential at the gate of the transistor $T_{14}$ rises to 4 V, and a further 15 ns is required until the potential at the output terminal OUT rises to 4.5 V. Thus, 35 ns is required for the switching time as a whole. On the contrary, according to the circuit of the embodiment of the present invention of FIG. 2, under the condition that the load capacitor $C_{22}$ is 10 pF, the current flowing through $T_{22}$ and $T_{23}$ 100 μA, and all the other conditions are the same as that in FIG. 1, 10 ns is required from the time point when the input signal changes from a high level to a low level to the time point when the potential at the gate of the transistor $T_{26}$ rises to 4.5 V, and a further 12 ns is required for the potential at the output terminal OUT to rise to 4.5 V. Thus, the total switching speed is 22 ns. Accordingly, the switching speed of the circuit of FIG. 2 is about 1.6 times faster under the same load condition.

When the input signal at the terminal I is changed from a low level to a high level, the transistors $T_{23}$, $T_{25}$ and $T_{27}$ are turned on, and the potential at the gate of the transistor $T_{24}$ and the potential at the gate of the transistor $T_{26}$ drop to ground potential. Therefore, the transistor $T_{26}$ is turned off. Thus, the charge in the capacitor $C_{22}$ flows through $T_{27}$ to ground, and the output terminal OUT is reduced to ground potential. In this case, the switching speed is almost equal to that of the prior art circuit of FIG. 1.

As stated above, the circuit of the present invention is suitable for driving a very large load capacitor with low power consumption and at high speed, and it is obvious that the effects thereof are superior than those of the prior art circuit of FIG. 1.

In the description of the circuit of FIG. 2, the transistors $T_{21}$ and $T_{26}$ are enhancement MOS transistors. However, the transistor $T_{21}$ may be any insulated-gate field-effect transistor which has the characteristic that it is turned off when a supply voltage is applied to the gate and source thereof, against the substrate potential. Thus, it is more effective to use a transistor whose threshold voltage is zero or a value slightly toward the depletion side. The transistor $T_{26}$ may be a depletion MOS transistor without affecting the operation of the circuit, but in this case, from power consumption and the switching speed considerations, it is more effective that its threshold voltage is zero or a value slightly toward the depletion side.

Figure 3:
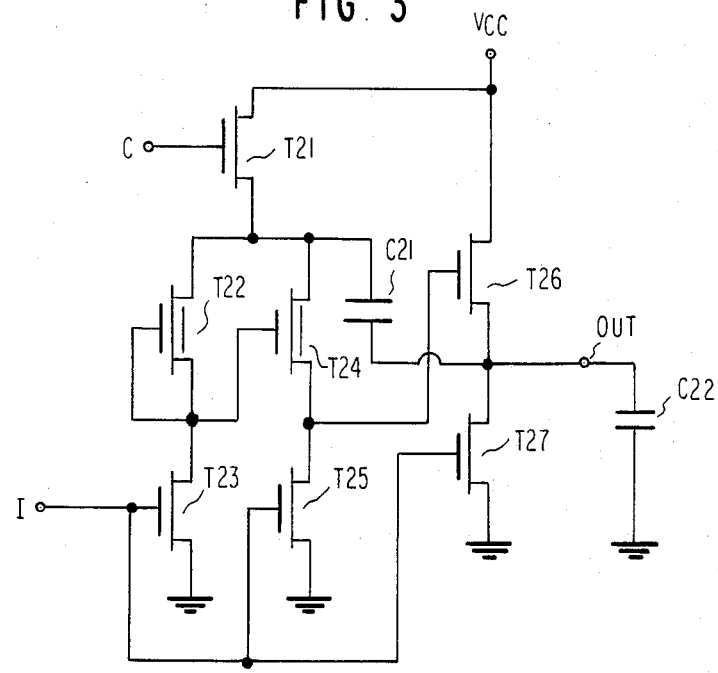
FIG. 3 is a circuit diagram showing a modified embodiment of FIG. 2.

The embodiment of FIG. 3 differs from FIG. 2 only in that the gate of $T_{21}$ is connected to a control input C rather than to the power supply $V_{cc}$. When the circuit is not operating, the control C is set at ground potential to further reduce power consumption. As in the case of FIG. 2, the transistor $T_{26}$ may be a depletion mode or enhancement mode transistor.

Figure 4:
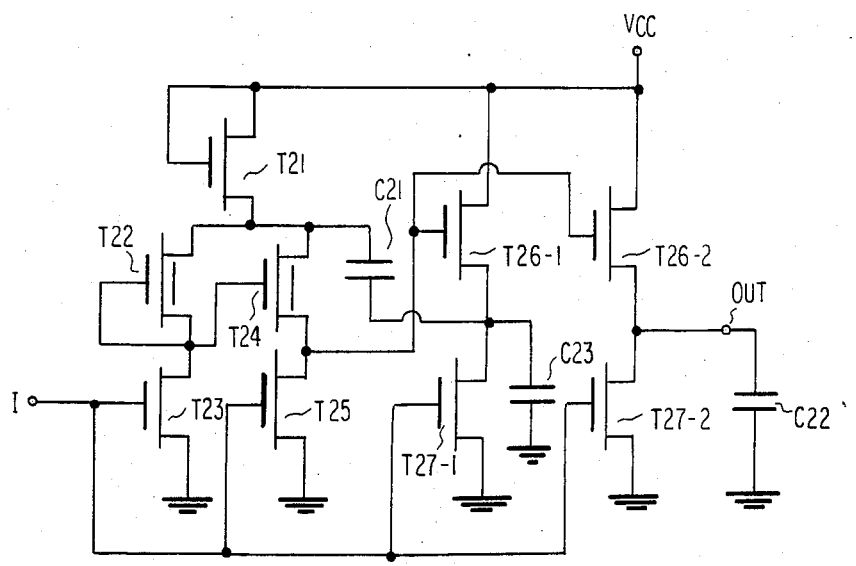
FIG. 4 is a circuit diagram showing a driving circuit according to another embodiment of the present invention.

With reference to FIG. 4, a driving circuit according to another embodiment will be described.

In FIG. 4, the portions corresponding to those in FIG. 2 are indicated by similar references. The circuit connection with respect to the transistors $T_{21}$, $T_{22}$, $T_{23}$, $T_{24}$ and $T_{25}$ is the same as that in FIG. 2. In this embodiment, in place of the output stage inverter composed of the transistors $T_{26}$ and $T_{27}$ of FIG. 2, an output stage composed of MOS transistors $T_{26-1}$, $T_{26-2}$, $T_{27-1}$ and $T_{27-2}$ is provided. Namely, the output stage in this embodiment includes two series circuits, one composed of the transistors $T_{26-1}$ and $T_{27-1}$, the other composed of the transistors $T_{26-2}$ and $T_{27-2}$. The purpose of the series circuit composed of the transistors $T_{26-1}$ and $T_{27-1}$ is to drive a capacitor $C_{21}$, while the purpose of the other series circuit composed of the transistors $T_{26-2}$ and $T_{27-2}$ is to drive a load capacitor $C_{22}$.

The capacitance $C_{23}$ shown attached to the output of the first series circuit is a stray capacitance and its value is far smaller than that of the load capacitance $C_{22}$. The conductance of transistor $T_{26-1}$ is smaller than that of transistor $T_{26-2}$, and the conductance of transistor $T_{27-1}$ is smaller than that of transistor $T_{27-2}$.

When the input signal at input terminal I is at a high level, transistors $T_{23}$, $T_{25}$, $T_{27-1}$ and $T_{27-2}$ are turned on and the gates of transistors $T_{24}$, $T_{26-1}$ and $T_{26-2}$ are grounded. Thus, the transistor $T_{26-2}$ is turned off, and the output terminal OUT is grounded. At this time, the power consumption is the sum of the currents flowing through the transistor $T_{21}$. The voltage at one end of capacitor $C_{21}$ connected to the source of transistor $T_{21}$ is at the value of $V_{cc}-V_{th}$.

When the input signal changes from a high level to a low level, transistors $T_{23}$, $T_{25}$, $T_{27-1}$ and $T_{27-2}$ are turned off. Since the gate of the transistor $T_{24}$ changes to a high level, the gates of transistors $T_{26-1}$ and $T_{26-2}$ are raised to a high level and are turned on. Accordingly, the potential at the output terminal OUT rises to a high level, the potential at the source of the transistor $T_{26-1}$ also rises, and a boot-strap effect due to $C_{21}$ makes the voltages at the drains of transistors $T_{22}$ and $T_{24}$ rise. As a result, the potential at the gate of the transistor $T_{24}$ rises further, through the transistor $T_{22}$. Consequently, the potential at the source of the transistor $T_{24}$ rises, and this rise makes the potentials at the gates of the transistors $T_{26-1}$ and $T_{26-2}$ rise, so that the driving capability of $T_{26-2}$ is increased and the potential rise at the terminal OUT is accelerated. This is how the load capacitor $C_{22}$ can be charged while maintaining the potential difference between the source and the gate of the transistor $T_{26-2}$ almost equal to the potential of $V_{cc}-V_{th}$. During this operation, the gate of the transistor $T_{24}$ has a higher potential for driving the transistors $T_{26-1}$ and $T_{26-2}$ than the source of the transistor $T_{24}$, and thus the speed of charging the gate of transistor $T_{26-2}$ is increased. Also, the load capacitor $C_{23}$ connected to the source of transistor $T_{26-1}$, is much smaller than the load capacitor $C_{22}$. Thus, the speed of charging $C_{23}$ is very high. This means that the voltage rise at the source of the transistor $T_{21}$ and at the drains of the transistors $T_{22}$, $T_{24}$ due to the boot-strap effect by the capacitor $C_{21}$ is faster. As a result, the rise of the potential at the gates of transistors $T_{26-1}$ and $T_{26-2}$ can be accelerated.

When the input signal changes from a low level to a high level, the transistors $T_{23}$, $T_{25}$, $T_{27-1}$ and $T_{27-2}$ are turned on, the potentials at the gates of transistors $T_{24}$, $T_{26-1}$ and $T_{26-2}$ become ground potential, and hence the transistors $T_{24}$, $T_{26-1}$ and $T_{26-2}$ are turned off. The charges in the capacitors $C_{23}$ and $C_{22}$ flow through the transistors $T_{27-1}$ and $T_{27-2}$ to ground, and the output OUT reaches ground potential.

In this embodiment, the gate of the transistor $T_{21}$ may be connected to an independent control signal, and when the circuit is not operating, the transistor $T_{21}$ is made non-conducting so that the power consumption may be reduced.

Though the present invention has been explained in connection with preferred embodiments, it should be apparent that the present invention is not limited to those embodiments.

What is claimed:

1. A driving circuit comprising an impedance element having a first terminal connected to a first voltage terminal and a second terminal, said impedance element transferring electric charge at said first voltage terminal to said second terminal and transferring substantially no electric charge at said second terminal to said first voltage terminal thereby to allow said second terminal to assume a potential larger than the potential at said first voltage terminal, a first series circuit of first and second field effect transistors coupled between said second terminal of said impedance element and a second voltage terminal, a second series circuit of third and fourth field effect transistors coupled between said second terminal of said impedance element and said second voltage terminal, a third series circuit of fifth and sixth field effect transistors coupled between said first voltage terminal and said second voltage terminal, a capacitor means coupled between said second terminal of said impedance element and the intermediate junction of said third series circuit, means for supplying gates of said second, fourth and sixth transistors with an input signal, means for connecting a gate of said first transistor to the intermediate junction of said first series circuit, means for connecting the intermediate junction of said first series circuit to a gate of said third transistor, and means for connecting the intermediate junction of said second series circuit to a gate of said fifth transistor, wherein the potential at said second terminal of said impedance element is raised above the potential at said first voltage terminal through said capacitor means in response to a rise in potential at said intermediate junction of said third series circuit.

2. The circuit according to claim 1, wherein said impedance element includes a load field effect transistor whose drain-source current path is connected between said first and second terminals.

3. The circuit according to claim 1, wherein said first transistor is a depletion type transistor with a gate connected to the intermediate junction of said first series circuit.

4. The circuit according to claim 1 wherein said third transistor is a depletion type transistor.

5. The circuit according to claim 2, wherein said load transistor is controlled by a control signal.

6. The circuit according to claim 1, wherein the conductance of said fifth transistor is larger than that of said third transistor.

7. The circuit according to claim 1, further comprising a fourth series circuit of seventh and eighth field effect transistors coupled between said first and second voltage terminals, means for connecting a gate of said seventh transistor to said intermediate junction of said second series circuit, and means for supplying a gate of said eighth transistor with said input signal.

8. The circuit according to claim 7, in which said load transistor is a depletion type transistor.

9. The circuit according to claim 8, wherein the conductance of said load transistor is larger than that of said fifth transistor.

10. A driving circuit comprising a load field effect transistor having a drain-source path coupled between a first voltage terminal and a first voltage terminal and a gate connected to said second terminal, a first series circuit of first and second field effect transistors coupled between said second terminal and a second voltage terminal, a second series circuit of third and fourth field effect transistors coupled between said second terminal and said second voltage terminal, said first and third transistors being of a depletion type and having gates connected to the intermediate junction of said first series circuit, said load transistor and said second and fourth transistors being of an enhancement type, a third series circuit of fifth and sixth field effect transistors coupled between said first voltage terminal and said second voltage terminal, a capacitor means coupled between the intermediate junction of said third series circuit and said second terminal of said impedance means, means for supplying gates of said second, fourth and sixth transistors with an input signal, and means for connecting the intermediate junction of said second series circuit to a gate of said fifth transistor.

* * * * *

UNITED STATES PATENT AND TRADEMARK OFFICE
CERTIFICATE OF CORRECTION

PATENT NO. : 4,680,488
DATED : July 14, 1987
INVENTOR(S) : K. OKUMURA et al

It is certified that error appears in the above-identified patent and that said Letters Patent is hereby corrected as shown below:

COLUMN 8, LINE 1    After "a" delete "first voltage" and insert --second--.

Signed and Sealed this

Eleventh Day of October, 1988

Attest:

DONALD J. QUIGG

Attesting Officer

Commissioner of Patents and Trademarks